United States Patent
Liao et al.

(10) Patent No.: US 9,536,031 B2
(45) Date of Patent: Jan. 3, 2017

(54) REPLACEMENT METHOD FOR SCAN CELL OF INTEGRATED CIRCUIT, SKEWABLE SCAN CELL AND INTEGRATED CIRCUIT

(71) Applicant: MediaTek Inc., Hsin-Chu (TW)

(72) Inventors: Jen-Yi Liao, Chubei (TW); Jen-Hang Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 212 days.

(21) Appl. No.: 14/330,146

(22) Filed: Jul. 14, 2014

(65) Prior Publication Data
US 2016/0011258 A1    Jan. 14, 2016

(51) Int. Cl.
*G06F 9/455* (2006.01)
*G06F 17/50* (2006.01)
*G01R 31/3185* (2006.01)

(52) U.S. Cl.
CPC ... *G06F 17/5072* (2013.01); *G01R 31/318541* (2013.01); *G01R 31/318583* (2013.01); *G06F 2217/14* (2013.01)

(58) Field of Classification Search
USPC ........................................................ 716/108
See application file for complete search history.

(56) References Cited

U.S. PATENT DOCUMENTS

| 2006/0026473 A1* | 2/2006 | Patrick Tan | G01R 31/31859 714/726 |
| 2006/0282727 A1* | 12/2006 | Hoshaku | G01R 31/31857 714/726 |
| 2007/0101108 A1* | 5/2007 | Grossman | G06F 9/461 712/228 |
| 2009/0032899 A1* | 2/2009 | Irie | G06F 17/5059 257/499 |

\* cited by examiner

*Primary Examiner* — Bryce Aisaka
(74) *Attorney, Agent, or Firm* — McClure, Qualey & Rodack, LLP

(57) ABSTRACT

A replacement method for scan cell of an integrated circuit (IC) is provided. A gate-level netlist of the IC is obtained. A place-and-route process is performed on the gate-level netlist to obtain a first netlist. A clock tree synthesis process is performed on the first netlist to obtain a second netlist. Static timing analysis is performed to analyze a plurality of first scan cells of the second netlist in normal mode and scan mode. The first scan cell is replaced with a second scan cell according to the static timing analysis that indicates the replaced first scan cell has a specific time margin in the scan mode. A first skew of the normal mode and a second skew of the scan mode are adjusted symmetrically in the first scan cell. The first skew and the second skew are adjusted asymmetrically in the second scan cell.

20 Claims, 8 Drawing Sheets

REPLACEMENT METHOD FOR SCAN CELL OF INTEGRATED CIRCUIT, SKEWABLE SCAN CELL AND INTEGRATED CIRCUIT

BACKGROUND OF THE INVENTION

Field of the Invention

The invention relates to a scan cell of an integrated circuit, and more particularly to a scan cell having an asymmetric skew in normal/scan mode.

Description of the Related Art

After integrated circuit (IC) chips are manufactured, tests are performed on the chips to verify whether the chips are normal. At present, Design-For-Testability (DFT) mechanisms for an IC chip include utilizing a plurality of scan cells to perform manufacturing tests on the IC chip.

In the design process for an IC chip, various clock trees are inserted into the circuit design of the IC chip, and the physical placement is adjusted accordingly. Clock adjustment is then performed on the circuit. In the process of designing and inserting the clock tree, clock skew is important to consider. All sequential logic units (e.g. registers and latches) of the circuit need a clock signal. However, the time of the clock signal arriving at different sequential logic units is different because the path from the clock source to each sequential logic unit is different. This time difference is also called a clock skew. There are various factors leading to a clock skew, including the path length difference among different units, the load number and size difference, the difference caused by OCV (on-chip variation), etc. OCV includes manufacturing technical variation, operational voltage variation, ambient temperature variation, etc.

BRIEF SUMMARY OF THE INVENTION

A replacement method for scan cell of integrated circuit and the skewable scan cells are provided. An embodiment of a replacement method for scan cell of an integrated circuit is provided. A gate-level netlist of the integrated circuit is obtained. A place-and-route process is performed on the gate-level netlist to obtain a first netlist. A clock tree synthesis process is performed on the first netlist to obtain a second netlist. A static timing analysis is performed to analyze a plurality of first scan cells of the second netlist in a normal mode and a scan mode, wherein the first scan cells form a plurality of scan chains. The first scan cell is replaced with a second scan cell according to the static timing analysis, wherein the static timing analysis indicates that the replaced first scan cell has a specific time margin in the scan mode. A first skew of the normal mode and a second skew of the scan mode are adjusted symmetrically in the first scan cell, and the first skew of the normal mode and the second skew of the scan mode are adjusted asymmetrically in the second scan cell.

Furthermore, an embodiment of a skewable scan cell is provided. An output unit receives a first signal from a normal path and a second signal from a scan path to output an output signal. At least one first unit disposed in the normal path provides the first signal corresponding to an input signal in a normal mode and the first signal having a first fixed logic level in a scan mode. At least one second unit disposed in the scan path provides the second signal corresponding to a scan signal in the scan mode and the second signal having a second fixed logic level in the normal mode. A first timing compensation unit disposed in the normal path comprises a plurality of clock buffers for adjusting a first skew of the input signal in the normal mode. A second timing compensation unit disposed in the scan path comprises a plurality of clock buffers for adjusting a second skew of the scan signal in the scan mode.

Moreover, another embodiment of a skewable scan cell is provided. An output unit receives a first clock from a normal path and a second clock from a scan path to output an output clock. At least one first unit disposed in the normal path provides the first clock according to an input clock and a scan enable signal. At least one second unit disposed in the scan path provides the second clock according to a scan clock and the scan enable signal. A first timing compensation unit comprises a plurality of clock buffers for adjusting a first skew of the input clock in the normal path. A second timing compensation unit comprises a plurality of clock buffers for adjusting a second skew of the scan clock in the scan path.

Furthermore, an embodiment of an integrated circuit is provided. The integrated circuit comprises a scan circuit. The scan circuit comprises a plurality of skewable scan cells, wherein the skewable scan cells are partitioned into a first group and a second group. The skewable scan cell in the first group provides an output signal according to a normal clock in a normal mode and a first scan clock in a scan mode, and the skewable scan cell in the second group provides the output signal according to the normal clock in the normal mode and a second scan clock in the scan mode. The first scan clock is inverted relative to the second scan clock, and a skew of the normal mode and a skew of the scan mode are adjusted asymmetrically.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
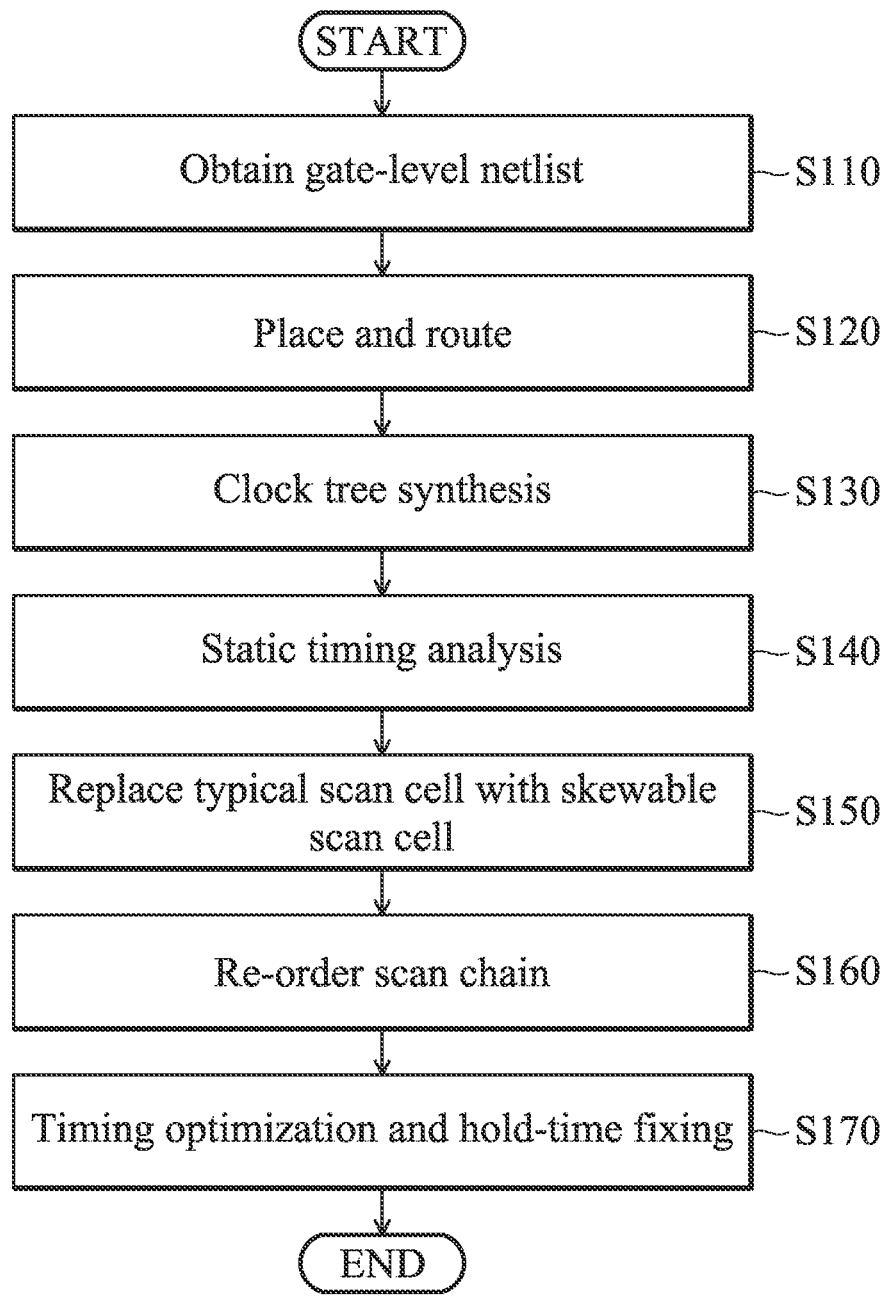
FIG. 1 shows a replacement method for an auto place-and-route (APR) netlist of an integrated circuit (IC) according to an embodiment of the invention, wherein the replacement method is performed by a processor capable of executing an electronic design automation (EDA) tool.

FIG. 1 shows a replacement method for scan cells of an integrated circuit (IC) according to an embodiment of the invention, wherein the replacement method is performed by a processor capable of executing an electronic design automation (EDA) tool. First, in step S110, a gate-level netlist of the IC is obtained. In general, the gate-level netlist is obtained by synthesizing a hardware description language (HDL) code of the IC and performing a design for testability (DFT) process to replace the logic cells with the scan cells for the IC, wherein the scan cells form a plurality of scan chains. Next, in step S120, a place-and-route process is performed on the gate-level netlist, to obtain a placement netlist. Next, in step S130, a clock tree synthesis (CTS) process is performed on the placement netlist, to obtain a synthesis netlist. Next, in step S140, a static timing analysis (STA) is performed to analyze timing of the synthesis netlist in a normal mode and a scan mode for each scan cell, wherein the scan cell is a typical scan cell, and a skew of the normal mode and a skew of the scan mode are adjusted symmetrically in the typical scan cell. Next, in step S150, according to the STA result obtained in step S140, a scan cell swap process is performed to replace the scan cell having a longer setup time margin or a longer hold time margin in the scan mode with a specific scan cell, so as to obtain a swapping netlist. In the embodiment, the specific scan cell is a skewable scan cell, and a skew of the normal mode and a skew of the scan mode are adjusted asymmetrically in the skewable scan cell. Next, in the swapping netlist, the scan chain comprising the specific scan cell is re-ordered (step S160). For example, the placement of the related cells in the scan chain will be fine-tuned. Next, in step S170, a timing optimization process and a hold-time fixing process are performed on the swapping netlist, to obtain a post-netlist. Thus, an automated place-and-route (APR) procedure is completed for skewable scan cell swapping.

Figure 2:
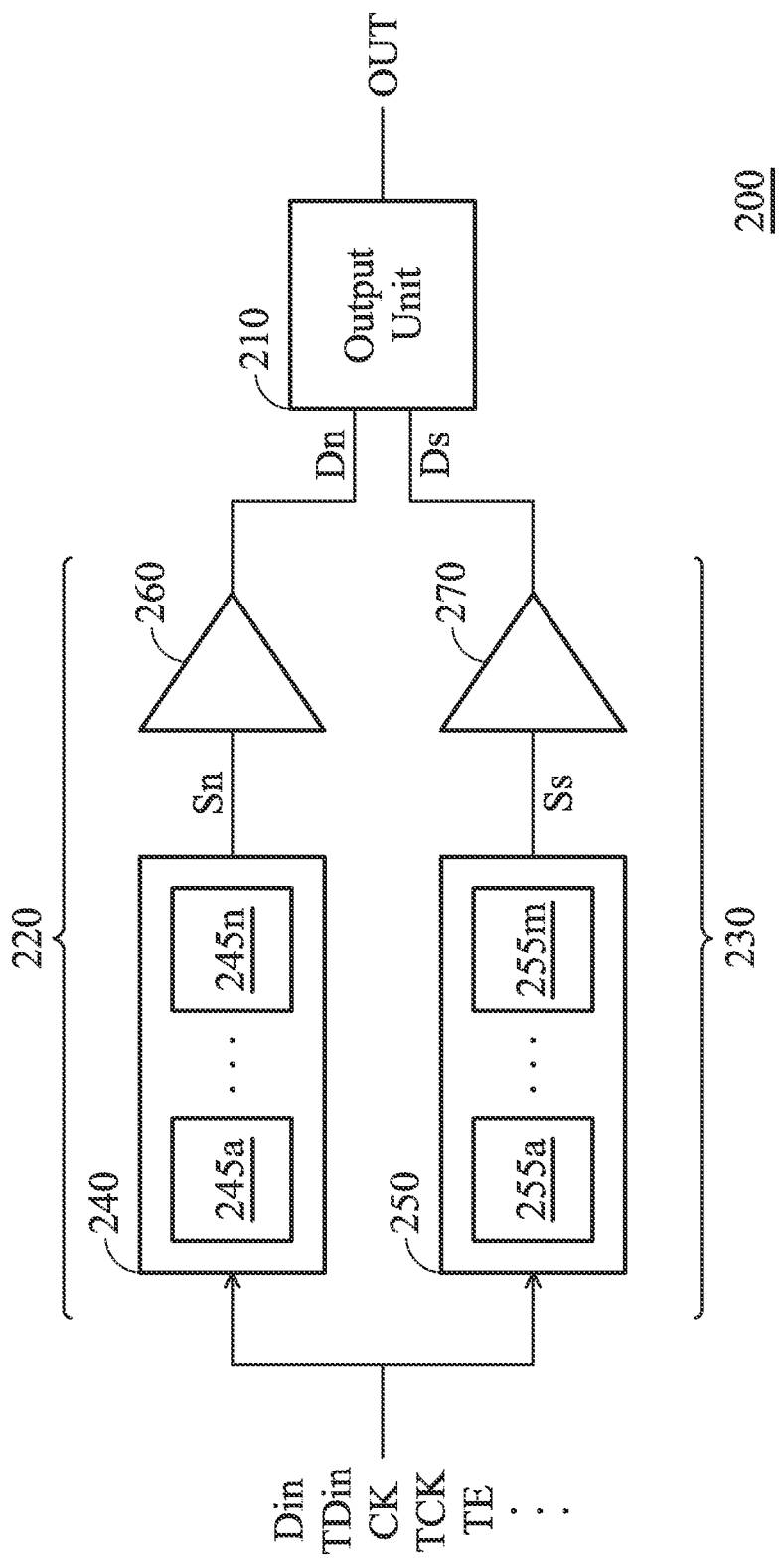
FIG. 2 shows a skewable scan cell according to an embodiment of the invention.

FIG. 2 shows a skewable scan cell 200 according to an embodiment of the invention. The skewable scan cell 200 comprises an output unit 210, wherein the output unit 210 provides an output signal OUT according to a normal signal Dn from a normal path 220 and a scan signal Ds from a scan path 230. In the skewable scan cell 200, the normal path 220 comprises a logic module 240, and the scan path 230 comprises a logic module 250. In embodiment, the logic module 240 comprises a plurality of logic units 245a-245n for providing a signal Sn according to the related input signals, such as Din, TDin, CK, TCK, TE and so on. Furthermore, the logic module 250 comprises a plurality of logic units 255a-255n for providing a signal Ss according to the related input signals. For example, the signal Din is an input signal in a normal mode for the skewable scan cell 200, and the signal TDin is a test signal in a scan mode for the skewable scan cell 200. Furthermore, the signal CK is a normal clock in the normal mode for the skewable scan cell 200, and the signal TCK is a test clock in the scan mode for the skewable scan cell 200. Moreover, the signal TE is a control signal for controlling the skewable scan cell 200 to enter the normal mode or the scan mode. Compared with a conventional scan cell, the skewable scan cell 200 further comprises a timing compensation unit 260 disposed in the normal path 220 and a timing compensation unit 270 disposed in the scan path 230, wherein the timing compensation units 260 and 270 comprises a plurality of clock buffers, and a quality of the clock buffers is determined according to the loading of the skewable scan cell 200 in the normal and scan modes, respectively. In FIG. 2, the output unit 210 can provide the output signal OUT corresponding to the normal signal Dn in the normal mode, and can provide the output signal OUT corresponding to the scan signal Ds in the scan mode. A skew of the normal path 220 produced by the timing compensation unit 260 and a skew of the scan path 230 produced by the timing compensation unit 270 are asymmetric. Thus, by using different timing compensation units 260 and 270, the skewable scan cell 200 can provide unbalanced tree latency for the output signal OUT in the scan mode and the normal mode. In the embodiment, the timing compensation unit 260 is coupled between the output unit 210 and the logic module 240, and the timing compensation unit 270 is coupled between the output unit 210 and the logic module 250. In another embodiment, the timing compensation unit 260 is implemented in the logic module 240, and the timing compensation unit 270 is implemented in the logic module 250.

Figure 3:
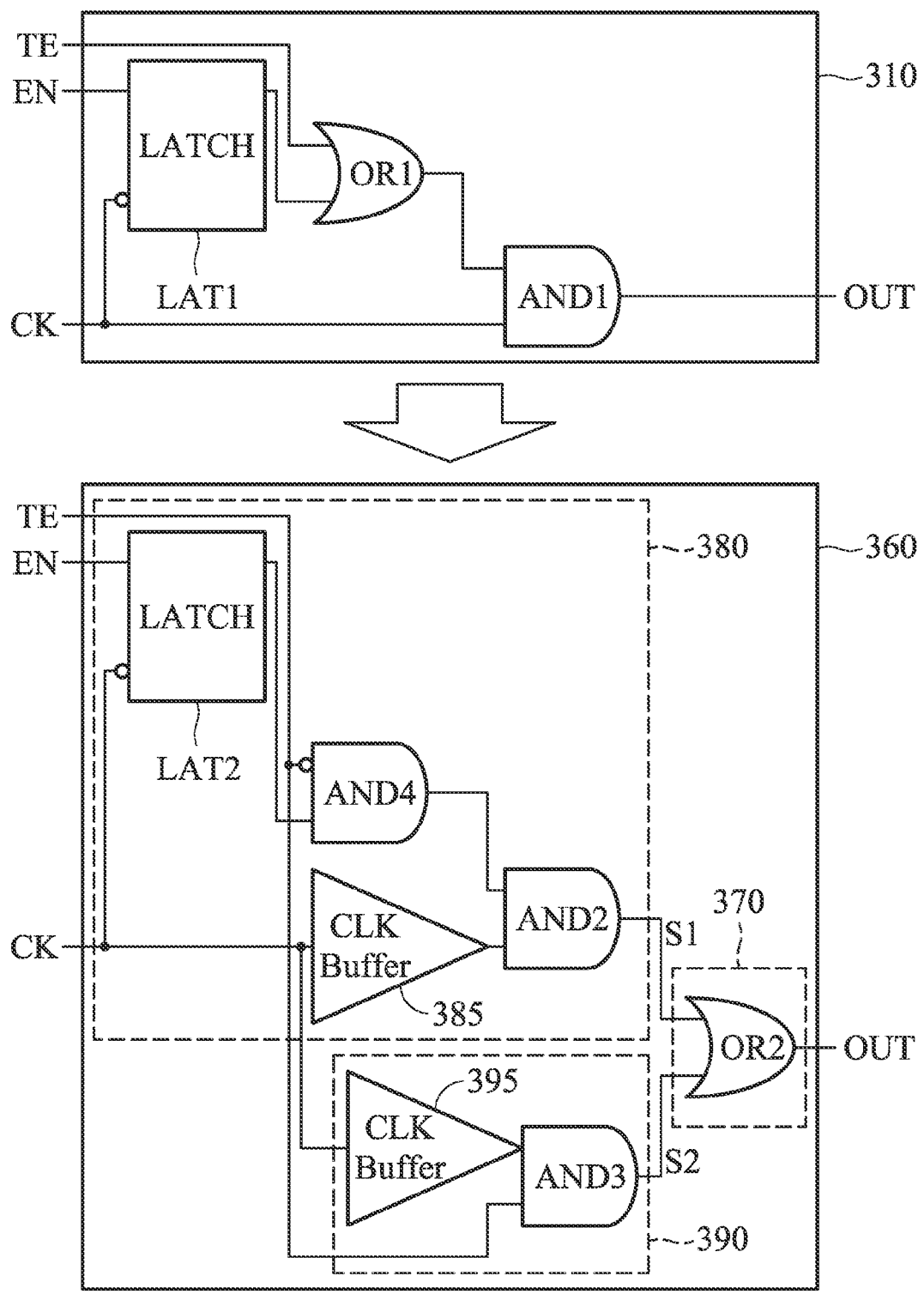
FIG. 3 shows a replacement example illustrating a typical clock gating scan cell being replaced with a skewable clock gating scan cell.

FIG. 3 shows a replacement example illustrating a typical clock gating scan cell 310 being replaced with a skewable clock gating scan cell 360. For the typical clock gating scan cell 310 or the skewable clock gating scan cell 360, a control signal TE is used to control the clock gating scan cell 310/360 to enter a normal mode or a scan mode. If the clock gating scan cell 310/360 operates in the normal mode, a normal clock is input as a clock signal CK, and an enable signal EN is used to determine whether to gate the clock signal CK for an output signal OUT. If the clock gating scan cell 310/360 operates in the scan mode, a scan clock is input as the clock signal CK, and the clock gating scan cell 310/360 provides the output signal OUT according to the clock signal CK. In general, a frequency of the scan clock is smaller than that of the normal clock. In FIG. 3, the typical clock gating scan cell 310 comprises a latch unit LAT1, an OR logic gate OR1 and a AND logic gate AND1, wherein no buffer is used in the typical clock gating scan cell 310 for timing adjustment. The skewable clock gating scan cell 360 comprises an output unit 370, a logic module 380 disposed in a normal path, and a logic module 390 disposed in a scan path. The output unit 370 comprises an OR logic gate OR2 for providing the output signal OUT according to an output S1 from the logic module 380 and an output S2 from the logic module 390. The logic module 380 comprises a latch unit LAT2, a AND logic gate AND2, a AND logic gate AND4, and a timing compensation unit 385. The logic module 390 comprises a AND logic gate AND3 and a timing compensation unit 395. In the normal mode, the logic module 380 provides the output S1 according to the clock signal CK and the enable signal EN, and the logic module 390 provides the output S2 having a low logic level, thus the output signal OUT is provided according to the output S1, wherein a skew of the output signal OUT is controlled by the timing compensation unit 385. Conversely, in the scan mode, the logic module 380 provides the output S1 having a low logic level, and the logic module 390 provides the output S2 corresponding to the clock signal CK, thus the output signal OUT is provided according to the output S2, wherein a skew of the output signal OUT is controlled by the timing compensation unit 395. Therefore, by using the timing compensation units 385 and 395, the skew of the output signal OUT is asymmetric in the normal and scan modes for the skewable clock gating scan cell 360.

Figure 4A:
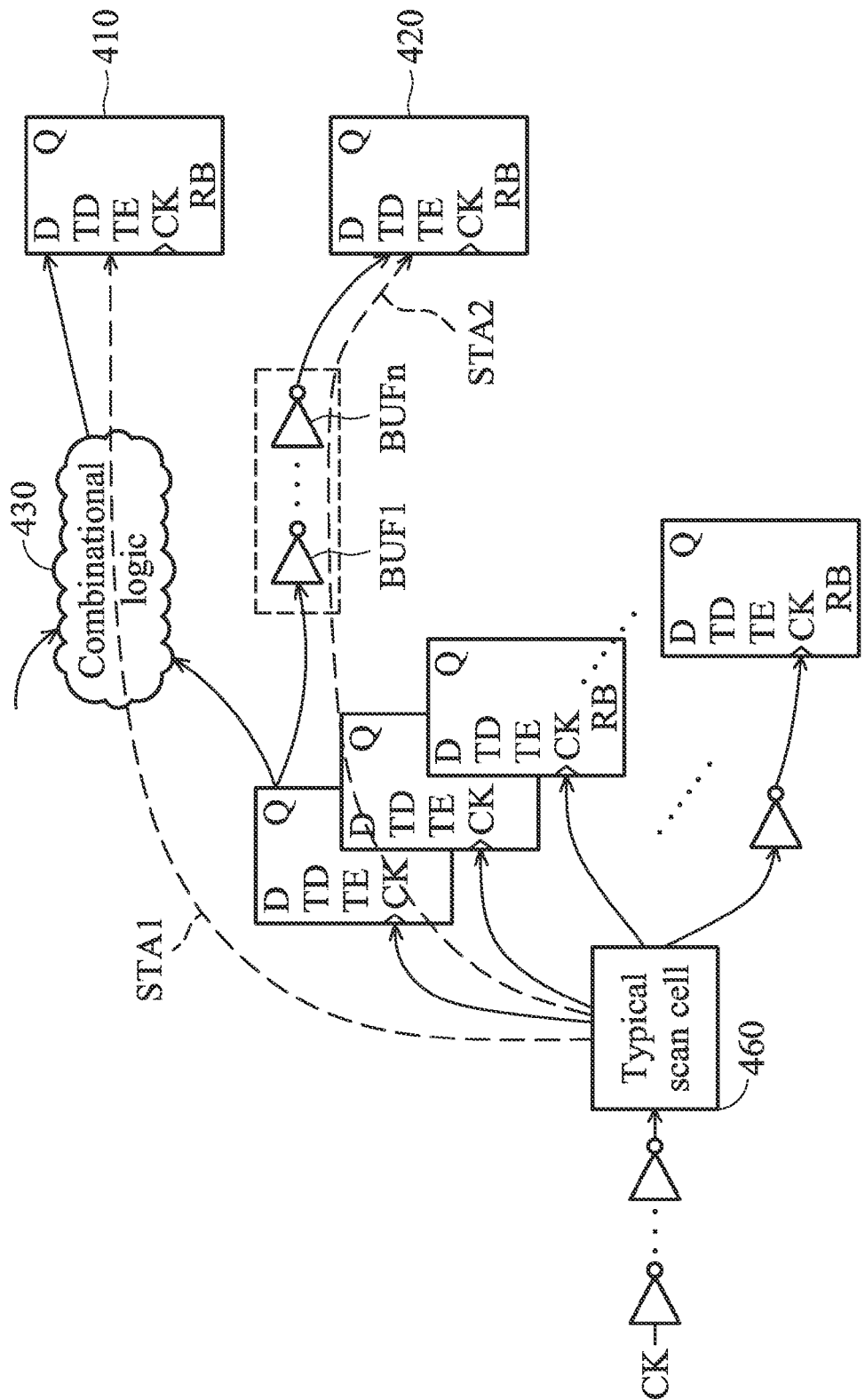
FIG. 4A shows a schematic diagram illustrating a typical clock gating scan cell used in a clock tree.
Figure 4B:
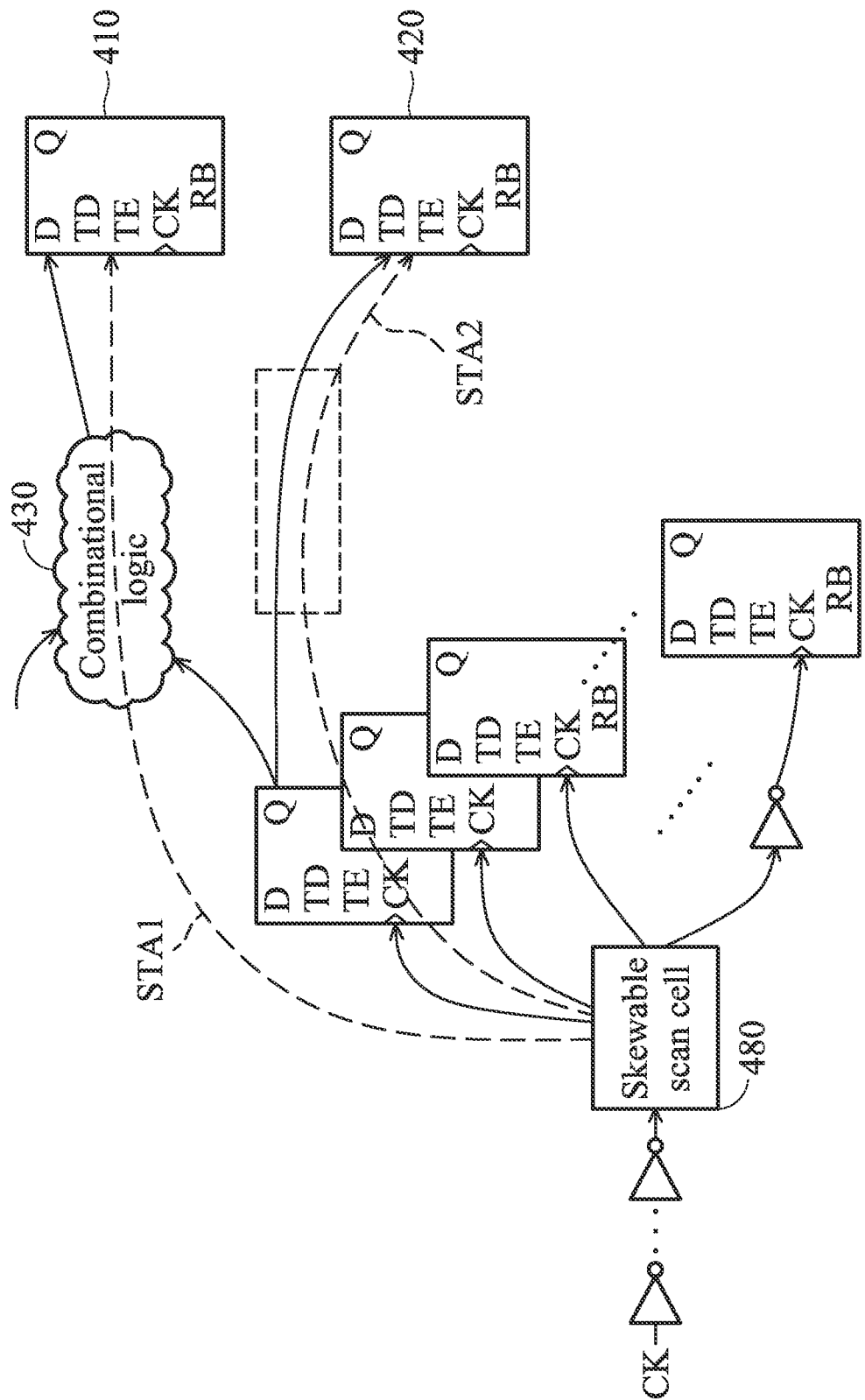
FIG. 4B shows a schematic diagram illustrating the typical clock gating scan cell of FIG. 4A being replaced with a skewable clock gating scan cell in the clock tree.

FIG. 4A shows a schematic diagram illustrating a typical clock gating scan cell 460 (e.g. 310 of FIG. 3) used in a clock tree, and FIG. 4B shows a schematic diagram illustrating the typical clock gating scan cell 460 of FIG. 4A being replaced with a skewable clock gating scan cell 480 (e.g. 360 of FIG. 3) in the clock tree. In FIG. 4A, in order to satisfy timing requirements from the typical clock gating scan cell 460 to the scan cell 410 via a combinational logic circuit 430 (as shown in path STA1), a plurality of buffers BUF1-BUFn are inserted between the scan cells 440 and 420 (as shown in path STA2). If the STA indicates that the scan mode timing margins exist in the clock tree, the typical clock gating scan cell 310 will be replaced with the skewable clock gating scan cell 480, as shown in FIG. 4B. In FIG. 4B, an output skew of the skewable clock gating scan cell 480 is asymmetric in the normal and scan modes because of different timing compensation units respectively disposed in the normal path and the scan path (e.g. the timing compensation units 385 and 395). Thus, the buffers BUF1-BUFn can be removed from the clock tree. It is to be noted that although the logic gate count of the skewable clock gating scan cell is higher than that of the typical clock gating scan cell (for example, the skewable clock gating scan cell 360 comprises 7 units, and the typical clock gating scan cell 310 comprises 3 units), the buffers to be removed occupy a greater area than the skewable clock gating scan cells. Therefore, chip area is decreased by using the skewable scan cells to replace the typical scan cells.

Figure 5:
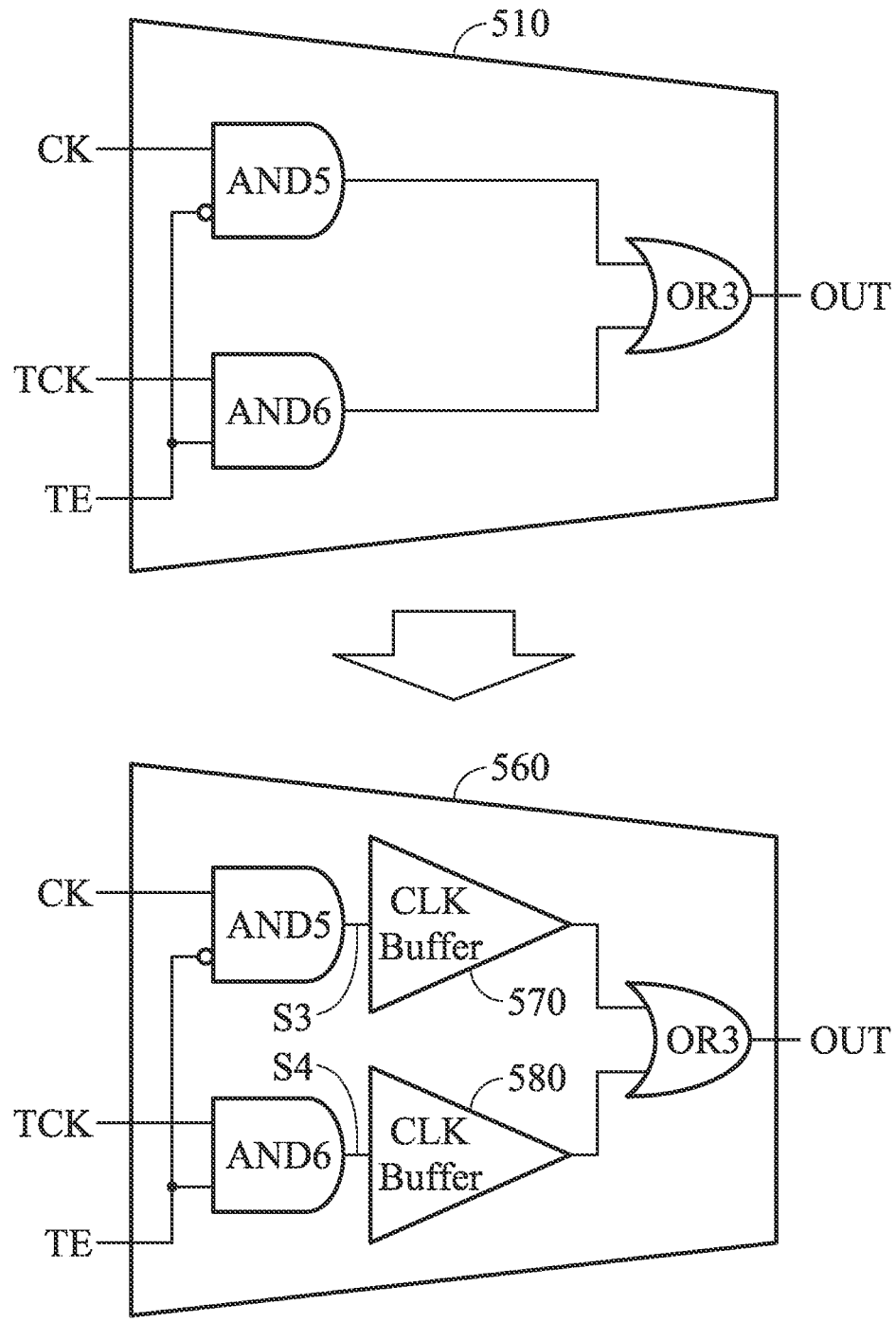
FIG. 5 shows a replacement example illustrating a typical multiplexer scan cell being replaced with a skewable multiplexer scan cell.

FIG. 5 shows a replacement example illustrating a typical multiplexer scan cell 510 being replaced with a skewable multiplexer scan cell 560. For the multiplexer scan cell 510 or the skewable multiplexer scan cell 560, a control signal TE is used to control the multiplexer scan cell 510/560 to enter a normal mode or a scan mode. If the multiplexer scan cell 510/560 operates in the normal mode, an output signal OUT corresponding to a normal clock CK is provided. If the multiplexer scan cell 510/560 operates in the scan mode, the output signal OUT corresponding to a scan clock TCK is provided. In general, a frequency of the scan clock TCK is smaller than that of the normal clock CK. In FIG. 5, the typical multiplexer scan cell 510 comprises an OR logic gate OR3 and two AND logic gates AND5 and AND6, wherein no buffer is used in the typical multiplexer scan cell 510 for timing adjustment. Compared with the typical multiplexer scan cell 510, the skewable multiplexer scan cell 560 further comprises a timing compensation unit 570 disposed in a normal path and a timing compensation unit 580 disposed in a scan path. The timing compensation unit 570 is coupled between the AND logic gate AND5 (e.g. a logic module of the normal path) and the OR logic gate OR3 (e.g. an output unit), and the timing compensation unit 580 is coupled between the AND logic gate AND6 (e.g. a logic module of the scan path) and the OR logic gate OR3 (e.g. the output unit). In the normal mode, the AND logic gate AND5 provides the output S3 according to the normal signal CK, and the AND logic gate AND6 provides the output S4 having a low logic level, thus the output signal OUT is provided according to the output S3, wherein a skew of the output signal OUT is controlled by the timing compensation unit 570. Conversely, in the scan mode, the AND logic gate AND5 provides the output S3 having a low logic level, and the AND logic gate AND6 provides the output S4 corresponding to the scan clock TCK, thus the output signal OUT is provided according to the output S4, wherein a skew of the output signal OUT is controlled by the timing compensation unit 580. Therefore, by using the timing compensation units 570 and 580, the skew of the output signal OUT is asymmetric in the normal and scan modes for the skewable multiplexer scan cell 560.

Figure 6:
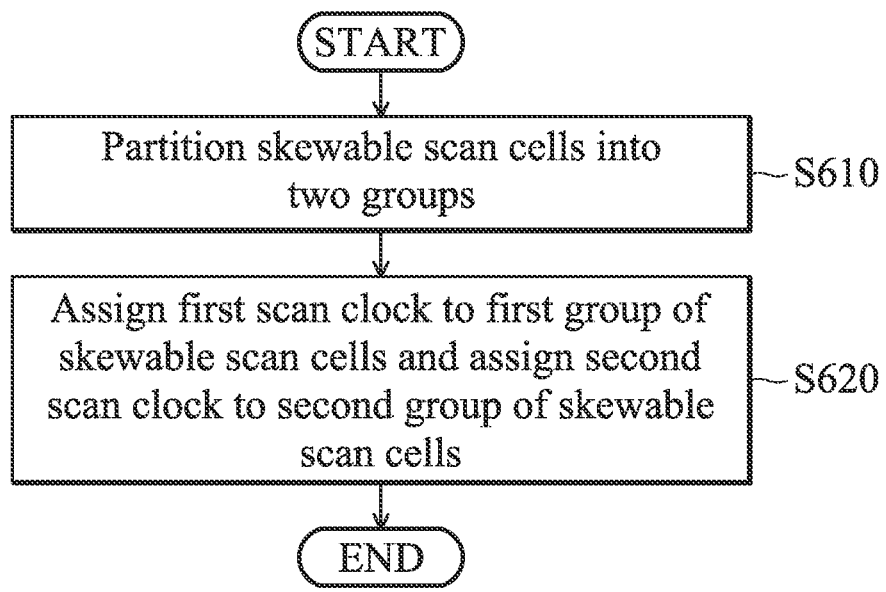
FIG. 6 shows a flow chart of the scan cell swap process of step S150 of FIG. 1 according to an embodiment of the invention.
Figure 7:
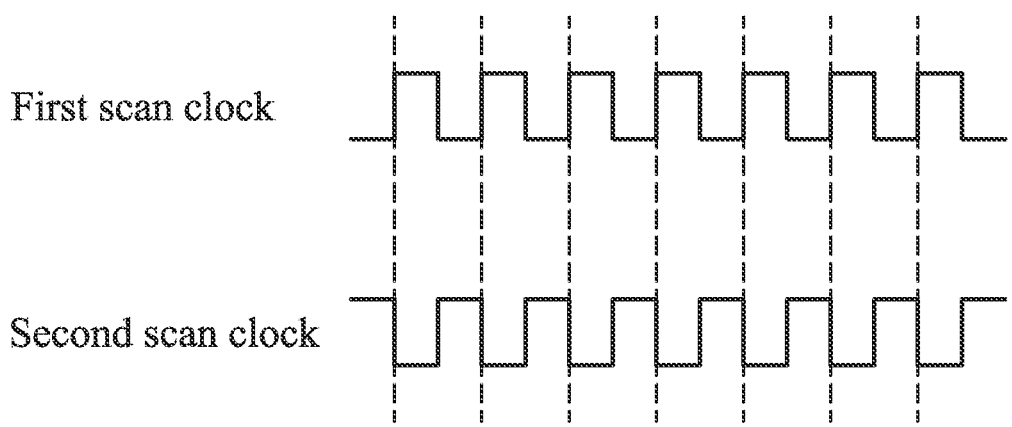
FIG. 7 shows a waveform diagram illustrating the relationship between the first scan clock and the second scan clock.
Figure 8:
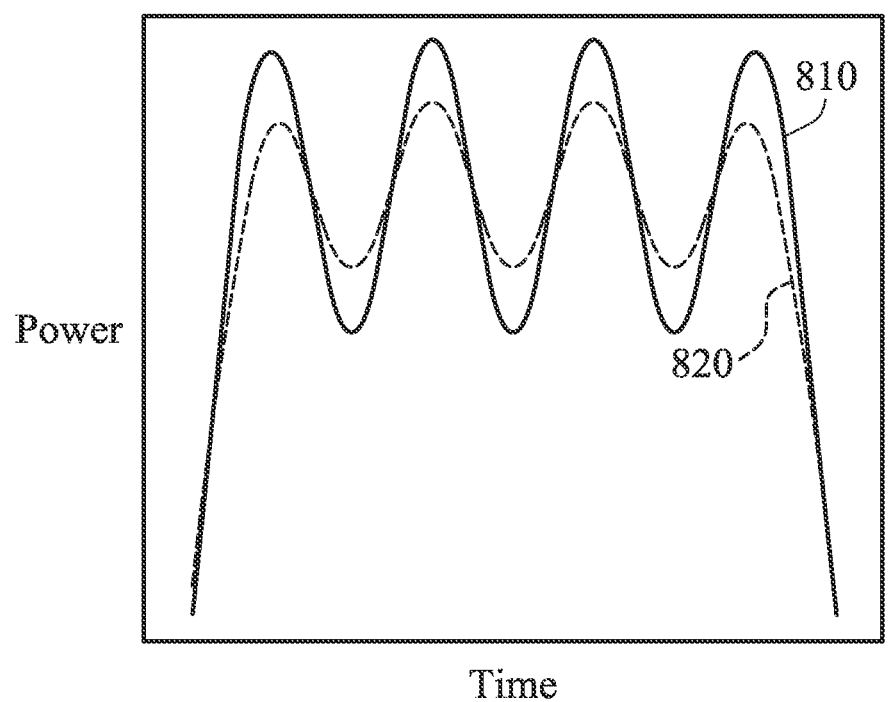
FIG. 8 shows a schematic illustrating power mitigation caused by a skewable scan cell replacement, wherein more than one scan clock is used in the skewable scan cell replacement.

FIG. 6 shows a flow chart of the scan cell swap process of step S150 of FIG. 1 according to an embodiment of the invention. First, in step S610, the skewable scan cells of a scan circuit are partitioned into two groups. Next, in step S620, a first scan clock is assigned to a first group of the skewable scan cells, and a second scan clock is assigned to a second group of the skewable scan cells, wherein the first scan clock is inverted relative to the second scan clock, as shown in FIG. 7. Therefore, in each scan cycle of the scan mode, each of the first group of the skewable scan cells can provide its output signal OUT in response to rising edge of the first scan clock, and each of the second group of the skewable scan cells can provide its output signal OUT in response to rising edge of the second scan clock. Thus, a voltage drop across the power of the IC (also referred to as IR-drop) mitigates in the scan mode. Referring to FIG. 8, FIG. 8 shows a schematic illustrating power mitigation caused by a skewable scan cell replacement. In FIG. 8, curve 810 represents an original IR-drop caused by the typical scan cells, and curve 820 represents a mitigation IR-drop caused by the skewable scan cells that use a plurality of scan clocks with different phases.

In an IC chip, some high-speed circuits (e.g. processors/DSPs) are critical in the clock trees of the normal mode, thus the timing margin in the normal mode is smaller than the timing margin in the scan mode. According to the embodiments, by using the skewable scan cells that have asymmetric skew in the scan and normal modes to replace the typical scan cells having larger timing margin, the number of timing buffers can be decreased for hold-time fixing. Thus, area and power consumption are decreased for the IC chip when normal mode clock tree latency is maintained after the CTS process of step S130 of FIG. 1. Furthermore, scan-shift IR-drop issue is also mitigated by using the skewable scan cells to fine-tune/re-distribute clock skews for the scan mode of the IC chip. Thus, scan-shift frequency (i.e. the frequency of the scan clock) can be increased, thereby test time and cost are decreased for the IC chip.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A replacement method for scan cell of an integrated circuit, comprising:
   obtaining a gate-level netlist of the integrated circuit;
   performing a place-and-route process on the gate-level netlist to obtain a first netlist;
   performing a clock tree synthesis process on the first netlist to obtain a second netlist;
   performing a static timing analysis to analyze a plurality of first scan cells of the second netlist in a normal mode and a scan mode, wherein the first scan cells form a plurality of scan chains;
   replacing at least one of the first scan cells with a second scan cell according to the static timing analysis to obtain a third netlist, wherein the static timing analysis indicates that the at least one first scan cell has a specific time margin in the scan mode; and fabricating the integrated circuit based on the third netlist, wherein a first skew of the normal mode and a second skew of the scan mode are adjusted symmetrically in the first scan cell, and the first skew of the normal mode and the second skew of the scan mode are adjusted asymmetrically in the second scan cell.

2. The replacement method as claimed in claim 1, further comprising:

ordering the scan chain having the second scan cell to obtain a third netlist; and performing a timing optimization process and a hold-time fixing process on the third netlist.

3. The replacement method as claimed in claim 1, further comprising:

partitioning the second scan cells into a first group and a second group;

assigning a first scan clock to the first group of the second scan cells; and assigning a second scan clock to the second group of the second scan cells;

wherein the first scan clock is inverted relative to the second scan clock.

4. The replacement method as claimed in claim 3, wherein the first group of the second scan cell provides an output signal according to a normal clock in the normal mode and the first scan clock in the scan mode, and the second scan cell of the second group provides the output signal according to the normal clock in the normal mode and the second scan clock in the scan mode.

5. The replacement method as claimed in claim 1, wherein the second scan cell comprises:

an output unit, receiving a first signal from a normal path and a second signal from a scan path to output the output signal;

at least one first unit disposed in the normal path, providing the first signal, wherein the first signal corresponds to a normal clock in the normal mode, and the first signal has a first fixed logic level in the scan mode;

at least one second unit disposed in the scan path, providing the second signal, wherein the second signal corresponds to a scan clock in the scan mode, and the second signal has a second fixed logic level in the normal mode;

a first timing compensation unit disposed in the normal path, comprising a plurality of clock buffers for adjusting a skew of the normal clock in the normal mode; and a second timing compensation unit disposed in the scan path, comprising a plurality of clock buffers for adjusting a skew of the scan clock in the scan mode.

6. The replacement method as claimed in claim 5, wherein a quantity of the clock buffers of the first timing compensation unit is determined according to a loading of the output unit in the normal mode, and a quantity of the clock buffers of the second timing compensation unit is determined according to the loading of the output unit in the scan mode.

7. The replacement method as claimed in claim 1, wherein the second scan cell comprises:

an output unit, receiving a first signal from a normal path and a second signal from a scan path to output the output signal;

at least one first unit disposed in the normal path, providing the first signal according to a normal clock in the normal mode;

at least one second unit disposed in the scan path, providing the second signal according to a scan clock in the scan mode;

a first timing compensation unit, comprising a plurality of clock buffers for adjusting the first skew of the normal clock in the normal path; and a second timing compensation unit, comprising a plurality of clock buffers for adjusting the second skew of the scan clock in the scan path.

8. The replacement method as claimed in claim 7, wherein a quantity of the clock buffers of the first timing compensation unit is determined according to a loading of the output unit in the normal mode, and a quantity of the clock buffers of the second timing compensation unit is determined according to the loading of the output unit in the scan mode.

9. A skewable scan cell, comprising:

an output unit, receiving a first signal from a normal path and a second signal from a scan path, to output an output signal;

at least one first unit disposed in the normal path, providing the first signal corresponding to an input signal in a normal mode and the first signal having a first fixed logic level in a scan mode;

at least one second unit disposed in the scan path, providing the second signal corresponding to a scan signal in the scan mode and the second signal having a second fixed logic level in the normal mode;

a first timing compensation unit disposed in the normal path, comprising a plurality of clock buffers for adjusting a first skew of the input signal in the normal mode; and a second timing compensation unit disposed in the scan path, comprising a plurality of clock buffers for adjusting a second skew of the scan signal in the scan mode.

10. The skewable scan cell as claimed in claim 9, wherein the first skew of the output signal and the second skew of the output signal are asymmetric.

11. The skewable scan cell as claimed in claim 9, wherein a quantity of the clock buffers of the first timing compensation unit is determined according to a loading of the output unit in the normal mode, and a quantity of the clock buffers of the second timing compensation unit is determined according to the loading of the output unit in the scan mode.

12. A skewable scan cell, comprising:

an output unit, receiving a first clock from a normal path and a second clock from a scan path to output an output clock;

at least one first unit disposed in the normal path, providing the first clock according to an input clock and a scan enable signal;

at least one second unit disposed in the scan path, providing the second clock according to a scan clock and the scan enable signal;

a first timing compensation unit, comprising a plurality of clock buffers for adjusting a first skew of the input clock in the normal path; and a second timing compensation unit, comprising a plurality of clock buffers for adjusting a second skew of the scan clock in the scan path.

13. The skewable scan cell as claimed in claim 12, wherein the first skew of the input clock in the normal path and the second skew of the scan clock in the scan path are asymmetric.

14. The skewable scan cell as claimed in claim 12 wherein the output unit outputs the output clock according to the first clock in a normal mode, and the output unit outputs the output clock according to the second clock in a scan mode.

15. The skewable scan cell as claimed in claim 14, wherein a quantity of the clock buffers of the first timing compensation unit is determined according to a loading of the output unit in the normal mode, and a quantity of the clock buffers of the second timing compensation unit is determined according to the loading of the output unit in the scan mode.

16. An integrated circuit, comprising:
a scan circuit, comprising:
a plurality of skewable scan cells, wherein the skewable scan cells are partitioned into a first group and a second group,
wherein the skewable scan cell in the first group provides an output signal according to a normal clock in a normal mode and a first scan clock in a scan mode, and the skewable scan cell in the second group provides the output signal according to the normal clock in the normal mode and a second scan clock in the scan mode, wherein the first scan clock is inverted relative to the second scan clock, and a skew of the normal mode and a skew of the scan mode are adjusted asymmetrically.

17. The integrated circuit as claimed in claim 16, wherein each of the skewable scan cells comprises:
an output unit, receiving a first signal from a normal path and a second signal from a scan path to output the output signal;
at least one first unit disposed in the normal path, providing the first signal according to the normal clock in the normal mode and the first signal having a first fixed logic level in the scan mode;
at least one second unit disposed in the scan path, providing the second signal corresponding to the first or second scan clock in the scan mode and the second signal having a second fixed logic level in the normal mode;
a first timing compensation unit disposed in the normal path, comprising a plurality of clock buffers for adjusting a skew of the normal clock in the normal mode; and
a second timing compensation unit disposed in the scan path, comprising a plurality of clock buffers for adjusting a skew of the first or second scan clock in the scan mode.

18. The integrated circuit as claimed in claim 17, wherein a quantity of the clock buffers of the first timing compensation unit is determined according to a loading of the output unit in the normal mode, and a quantity of the clock buffers of the second timing compensation unit is determined according to the loading of the output unit in the scan mode.

19. The integrated circuit as claimed in claim 16, wherein each of the skewable scan cells comprises:
an output unit, receiving a first signal from a normal path and a second signal from a scan path to output the output signal;
at least one first unit disposed in the normal path, providing the first signal according to the normal clock in the normal mode;
at least one second unit disposed in the scan path, providing the second signal according to the scan clock in the scan mode;
a first timing compensation unit, comprising a plurality of clock buffers for adjusting a first skew of the normal clock in the normal path; and
a second timing compensation unit, comprising a plurality of clock buffers for adjusting a second skew of the first or second scan clock in the scan path.

20. The integrated circuit as claimed in claim 19, wherein a quantity of the clock buffers of the first timing compensation unit is determined according to a loading of the output unit in the normal mode, and a quantity of the clock buffers of the second timing compensation unit is determined according to the loading of the output unit in the scan mode.

* * * * *